United States Patent
Nagai et al.

(10) Patent No.: US 7,157,002 B2
(45) Date of Patent: Jan. 2, 2007

(54) PROCESS FOR THE RECOVERY OF SURFACTANTS

(75) Inventors: Takabumi Nagai, Tsukuba (JP); Kazuhisa Fujii, Tsukuba (JP); Hideaki Asai, Tsukuba (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 10/561,176

(22) PCT Filed: Jun. 18, 2004

(86) PCT No.: PCT/JP2004/008967

§ 371 (c)(1),
(2), (4) Date: Dec. 16, 2005

(87) PCT Pub. No.: WO2004/112952

PCT Pub. Date: Dec. 29, 2004

(65) Prior Publication Data

US 2006/0124552 A1 Jun. 15, 2006

(30) Foreign Application Priority Data

Jun. 20, 2003 (JP) .............................. 2003-176139

(51) Int. Cl.
*B01D 11/00* (2006.01)
(52) U.S. Cl. ...................... 210/634; 210/633; 210/748; 210/767; 210/151; 210/188
(58) Field of Classification Search ................ 210/634, 210/633, 748, 767, 151, 188
See application file for complete search history.

(56) References Cited

U.S. PATENT DOCUMENTS

| 6,235,701 | B1 | 5/2001 | Senger Elsbernd |
| 2001/0025121 | A1 | 9/2001 | Matsushita et al. |
| 2002/0132192 | A1 | 9/2002 | Namatsu |
| 2004/0038532 | A1* | 2/2004 | Kawakami et al. .......... 438/689 |
| 2004/0231707 | A1* | 11/2004 | Schilling et al. .............. 134/34 |

FOREIGN PATENT DOCUMENTS

| JP | 6-114202 | 4/1994 |
| JP | 2000-138156 | 5/2000 |
| JP | 2001-247519 | 9/2001 |
| JP | 2002-543241 | 12/2002 |

\* cited by examiner

*Primary Examiner*—Chester T. Barry
(74) *Attorney, Agent, or Firm*—Sughrue Mion, PLLC (57) ABSTRACT

The present invention relates to a method for recovering a surfactant from a water-carbon dioxide system comprising at least one type of surfactant, water and carbon dioxide, the method comprising the step of bringing the water-carbon dioxide system into contact with a dehydrating agent to remove water. Furthermore, the present invention relates to a method comprising the steps of installing a device for selectively removing a removal target in a circulation line in which circulated is a mixed system comprising carbon dioxide, a carbon dioxide-compatible surfactant and/or a cosolvent, and a removal target; circulating the mixed system; and selectively removing the removal target that has been incorporated into the surfactant and/or cosolvent.

15 Claims, 3 Drawing Sheets

PROCESS FOR THE RECOVERY OF SURFACTANTS

TECHNICAL FIELD

The present invention relates to an environmental technology for the recovery and reuse of a surfactant for a chemical process in which a surfactant is used. In particular, the present invention relates to a technique for the recovery after use of a surfactant, which is necessary in using liquid, subcritical or supercritical carbon dioxide as an alternative solvent.

Furthermore, the present invention relates to a technique using a surfactant or a cosolvent for removing water, inorganic salts and like polar substances; polymers; etching residues; and contaminants, from a solvent that does not uniformly mix with polar solvents.

BACKGROUND ART

With increasing public awareness of environmental issues, there are concerns about the safety of chemical substances. In line with this trend, technical development has been promoted to replace organic solvents with carbon dioxide and like alternative solvents posing less environmental burden. However, due to the properties of carbon dioxide such as low polarity, the miscibility therewith of polar substances such as water, polymers, contaminants is significantly poor. To solve the miscibility problem, the use of $CO_2$-philic surfactants has been proposed, and the development of surfactants and novel systems that use such surfactants have been actively carried out. Examples of known surfactants are polyoxyalkylenes, polysiloxane, and fluoroorganic compounds. Among such surfactants, fluorine compounds are functionally superior. However, fluoro compounds are generally expensive and problematic in disposal, posing more severe environmental burdens than the two other types of compounds. Therefore, developing a method for reusing fluoro compounds is a great challenge. Although development of fluoro compounds and systems using such fluoro compounds in combination with supercritical carbon dioxide is currently promoted, no effective technique for the recovery of the surfactant has been established. To date, the only method known is decreasing the solubility of such a surfactant through pressure control to precipitate and then recover it (*J. Am. Chem. Soc.*, 1999, 121, 11902; *Chem. Eng.*, 2000, 72).

Indeed, prior-art surfactant separation and recovery methods are for removing surfactants that are problematic to waste water treatment from surfactant-containing aqueous solutions. Examples of such prior-art techniques are given below. However, there is no method at present that allows the recovery from a reverse micelle emulsion, in which water is dispersed in carbon dioxide, of just a surfactant with a purity suitable for reuse as desired by the inventors. Moreover, there is no technique that relates to a system allowing the efficient recovery and reuse of a surfactant in a high-pressure system of liquid, subcritical or supercritical carbon dioxide.

Prior-art methods for recovering surfactants are presented below:

1. Precipitation of a Surfactant By Salting Out or Addition of an Adsorbent or Flocculant This method requires surfactant purification by removing a salt or flocculant (Japanese Patent No. 2881384, Japanese Unexamined Patent Publication No. 2000-093944).

2. Removal of Water By Evaporation

This method uses a large amount of energy, takes a long period of time, and does not enable a surfactant to be recovered with a high purity. Moreover, this method is not usable with supercritical $CO_2$ equipment (Japanese Unexamined Patent Publication Nos. 1993-140779 and 1996-164301).

3. Centrifugation

A surfactant after centrifugation that contains impurities has to be purified using a method other than centrifugation. Moreover, water cannot be completely removed. This method takes a long period of time and requires a centrifuge. This method is not usable with supercritical $CO_2$ equipment (Japanese Patent No. 3382462).

4. Separation By a Separation Membrane (Ultrafiltration Membrane, Reverse Osmotic Membrane, Ion-Exchange Membrane)

This method requires expensive membrane separation equipment. Water cannot be completely removed with either ultrafiltration membranes or reverse osmotic membranes (a surfactant is obtainable only in the form of a concentrated aqueous solution). Ion-exchange membranes are not suitable for nonionic surfactants. With ionic surfactants, a process for extracting a surfactant adsorbed onto the membrane is necessary. Furthermore, the durability of organic membranes in supercritical $CO_2$ is questionable (Japanese Unexamined Patent Publication Nos. 1998-230149, 2002-058966, 1993-317654, 2002-059160, and 1996-020611).

5. Precipitation of a Surfactant By Cooling

This method needs energy for cooling and takes a long period of time. Impurities also precipitate as solids, necessitating a process for purifying the surfactant (Japanese Unexamined Patent Publication Nos. 2000-210679 and 1996-155205).

6. Separation Into Water and an Oil Component Containing a Surfactant by Applying an Electric Field in Order to Neutralize the Electric Charge of the Surfactant.

It is difficult to use this method for nonionic surfactants, and an electrolytic device is needed with this method and the procedure is complex and time-consuming. It is difficult to use this method with supercritical $CO_2$ equipment (Japanese Patent No. 3358786 and Japanese Unexamined Patent Publication No. 1997-164303).

7. Separation by Increasing Temperature Above the Cloud Point to Lower the Water Solubility of a Surfactant This method takes a long period of time and necessitates separation from impurities. Moreover, it is impossible to completely remove water (Japanese Unexamined Patent Publication Nos. 1999-033505, 1994-063534, 1993-269456, 1996-259471, 1996-332305 and 2003-088879).

With the drive toward smaller feature sizes of resist patterns, when resist patterns are washed with water and dried, the problem of image collapse, which occurs due to the capillary force of water, has been focused. In particular, when the pattern width of a semiconductor device is about 80 nm, pattern collapse is likely to occur, and 65 nm or finer patterns are even more likely to suffer pattern collapse.

In order to avoid pattern collapse, a method in which supercritical carbon dioxide is used has been proposed as a method for drying fine patterns. However, since resists are made from polymers, when they are treated with high-pressure carbon dioxide, they undergo bubbling and deformation due to water absorption. It is now understood that to prevent such phenomena, drying has to be performed after removing water with liquid carbon dioxide (Namatsu et al., *Chorinkairyuutaino saishin ouyou gijyutsu* (Latest application techniques for supercritical fluid), NTS, pp. 307–324; Otake et al., *Surface*, 2004, Vol. 40, No. 10, p. 360; *J. Vac. Sci. Technol.* B18(2), 780–784 (2000); Proceedings of SPIE, Vol. 5037 (2003). Heretofore, there has been no surfactant that can solubilize water in a pressure range in which carbon dioxide is liquid. Although the application of supercritical carbon dioxide to semiconductor processes other than resist pattern drying has been researched, even state-of-the-art high performance surfactants necessitate a pressure of about 300 atm to dissolve water in carbon dioxide in a proportion of several percent. Moreover, there are many problems with the recovery process, and it is also a problem that expensive surfactants have to be used in large amounts. As described above, it has been extremely difficult to handle polar substances and polymers in carbon dioxide with the use of small amounts of a cosolvent at a pressure of 100 to 150 atm, or lower practical pressures.

An object of the present invention is to provide a technique for reusing a surfactant without separating it from carbon dioxide in a water-carbon dioxide system containing the surfactant.

Another object of the present invention is to provide a method for washing, drying, or dehydrating precision machinery components or semiconductor wafers having fine patterns without resulting in pattern collapse.

Furthermore, another object of the present invention is to provide a technique for selectively removing a removal target in a mixed system containing carbon dioxide, a carbon dioxide-compatible surfactant and/or a cosolvent, and a removal target.

BRIEF DESCRIPTION OF THE DRAWINGS

In FIG. 1, 5 is a high-pressure device, 6 is a circulation pump, 7 is a circulation line, 8 is a removal device (a column packed with a dehydrating agent) to remove a removal target (water), 9 is a fluid pump, 10 is a $CO_2$ tank, 11 is a pressure gauge, and 12 is a thermometer.

In FIG. 2, 1 is a resist-furnished wafer, 2 is a rinsing fluid, 3 is a surfactant, 4 is a micelle (composed of a rinsing fluid and a surfactant), 5 is a high-pressure supercritical $CO_2$ device, 6 is a circulation pump, 7 is a circulation line, and 8 is a removal device (a column packed with a dehydrating agent) to remove a removal target (water).

FIG. 3(*a*) shows the results for Examples 3–4. In FIG. 3(*a*), patterns are not connected together. FIG. 3(*b*) shows the result for Comparative Example 6. In FIG. 3(*a*), adjacent patterns are all connected.

DISCLOSURE OF THE INVENTION

In order to solve the problems described above, it is necessary to reduce the amount of surfactant, and remove just a removal target such as water while reusing the surfactant in a high-pressure supercritical carbon dioxide system. In this way, the amount of surfactant needing to be dissolved in carbon dioxide can be reduced, and treatment can be performed using carbon dioxide of reduced pressure (to increase the amount of surfactant in carbon dioxide, high pressure is needed). Heretofore, to recover a surfactant from supercritical carbon dioxide, a very time-consuming and complex method had to be used in which the solubility of a surfactant is reduced by pressure control, the surfactant is separated after precipitation, and the surfactant is dissolved again for reuse. Therefore, no such system has been put into practice.

There is a method reported (Japanese Unexamined Patent Publication No. 2001-247519) in which water generated as a byproduct in an esterification reaction using supercritical carbon dioxide as an alternative solvent is removed while maintaining high pressure in the presence of a dehydrating agent, thereby enhancing the yield of the desired compound.

In view of this knowledge, the present inventors accomplished a method by which substances other than a surfactant can be removed by an adsorbent or the like from a supercritical carbon dioxide system, and just the surfactant can be reused while being dissolved in carbon dioxide.

Moreover, the inventors found that fine resist patterns and etching patterns in semiconductor production can be washed and dried without pattern collapse. These techniques are applicable to MEMS and micromachine productions. In addition, such operations can be performed with small amounts of surfactant and cosolvent in low-pressure carbon dioxide.

The present invention relates to methods as presented below.

1. A method for recovering a surfactant from a water-carbon dioxide system comprising at least one type of surfactant, water and carbon dioxide,
   the method comprising the step of bringing the water-carbon dioxide system into contact with a dehydrating agent to remove water.

2. The method according to Item 1, wherein the water-carbon dioxide system is a micelle, emulsion or homogenous dispersion system prepared by adding at least one type of surfactant to a two-phase system of water and carbon dioxide.

3. The method according to Item 1 or 2, wherein the water-carbon dioxide system comprises a non-surfactant component which is removed by adsorption together with or separately from water.

4. The method according to any one of Items 1, 2 and 3, wherein the surfactant is a fluorine-based surfactant.

5. The method according to any one of Items 1, 2 and 3, wherein a fluorine-based surfactant and a non-fluorine-based surfactant are used as surfactants, and a mixture of these surfactants is recovered.

6. The method according to any one of Items 1 to 5, wherein a cosolvent (entrainer) is used.

7. The method according to any one of Items 1 to 6, wherein the carbon dioxide is either liquid, subcritical or supercritical.

8. A method for recovering and reusing a surfactant,
   the method comprising the steps of, in an aqueous solution system of liquid, subcritical or supercritical carbon dioxide and an electrolyte, carrying out in the presence of at least one type of surfactant an electrochemical reaction, dehydrating the solution after the reaction, and recovering and reusing surfactant-containing carbon dioxide.

9. The method according to Item 8, wherein the electrochemical reaction is plating.

10. A method for recovering a surfactant,
    the method comprising the steps of washing, drying, or dehydrating a precision machinery component or a semiconductor wafer using a water-carbon dioxide system comprising at least one type of surfactant, water, and liquid, subcritical or supercritical carbon dioxide, and bringing the water-carbon dioxide system into contact with a dehydrating agent.
11. A method comprising the steps of installing a device for selectively removing a removal target in a circulation line in which circulated is a mixed system comprising carbon dioxide, a carbon dioxide-compatible surfactant and/or a cosolvent, and a removal target; circulating the mixed system; and selectively removing the removal target that has been incorporated into the surfactant and/or cosolvent.
12. The method according to Item 11, wherein the removal target is water, an inorganic salt, a resist residue or a contaminant.
13. The method according to Item 11 or 12, wherein the carbon dioxide is either supercritical, subcritical or liquid.
14. The method according to any one of Items 11 to 13, wherein the removal target is water and the removal device is filled with a dehydrating agent.
15. An apparatus for removing a removal target from a high-pressure fluid comprising carbon dioxide and a surfactant,
the apparatus being equipped with a high-pressure device into which carbon dioxide, a surfactant, and a removal target or an item comprising the removal target are introduced; a circulating pump for circulating in a circulation line a high-pressure fluid comprising carbon dioxide, a surfactant and the removal target; and a removal device in the high-pressure line for removing the removal target,
the apparatus being designed to selectively remove at the removal device a carbon dioxide-insoluble removal target incorporated into the high-pressure fluid in the form of a micelle, emulsion or homogenous dispersion system by means of the surfactant.

The present invention is described below in detail.

In a preferable embodiment of the present invention, a water-carbon dioxide system comprises water and carbon dioxide (either liquid, subcritical or supercritical) is brought into contact with a dehydrating agent to remove water, and a surfactant is then recovered.

In the water-carbon dioxide system of the present invention, carbon dioxide and water are immiscible. Once water and carbon dioxide are brought into contact, they form 2 phases. In the present invention, liquid, subcritical or supercritical carbon dioxide is preferably usable.

The amount of water in the water-carbon dioxide system is usually about 0.01 to about 99.9 wt. %, and preferably about 1 to about 90 wt. %.

Cosolvents herein refer to hydrophilic organic solvents that show compatibility with both carbon dioxide and polar substances such as water, as well as high molecular weight compounds. Examples are methanol, ethanol, propanol, and like alcohols; ethylene glycol; propylene glycol; glyme and like ethers; acetic acid, propionic acid, and like lower carboxylic acids; dimethylformamide and like amides; dimethyl sulfoxide and like lower sulfoxides; ethylene carbonate, propylene carbonate, and like cyclic carbonates; dimethyl carbonate, diethyl carbonate, and linear carbonates; acetone, methyl ethyl ketone, and like lower ketones; acetonitrile and like nitriles; and acetic acid and like lower carboxylic acids.

Examples of surfactants are anionic surfactants, cationic surfactants, nonionic surfactants, ampholytic surfactants, etc. One or more such surfactants can be used. Preferable surfactants are nonionic surfactants. Specific examples are polyethylene glycol, polypropylene glycol, polyoxyethylene-polyoxypropylene block copolymers and like polyoxyalkylene-based (block) polymers, polyols, polyol esters, polyol ethers, fluoroalkyl polyethylene glycols, polysiloxanes, etc. In particular, the higher the solubility in carbon dioxide, the more preferable. Furthermore, fluorine-based surfactants are preferable, and nonionic fluorine-based surfactants are particularly preferable. Such surfactants are capable of mixing water and carbon dioxide, which are immiscible, and can sufficiently function in an amount necessary to mix part of the water and carbon dioxide in the system.

Examples of fluorine-based surfactants particularly preferable herein are nonionic surfactants containing a perfluoropolyether group as a hydrophobic group and a polyoxyalkylene group as a hydrophilic group.

Examples of anionic surfactants are alkyl carboxylates and alkyl sulfonates. In particular, ammonium perfluoropolyether carboxylates, ammonium perfluorooctanoate, ammonium perfluorohexanoate, sodium perfluorohexansulfonoate, etc., all of which are fluorine-based surfactants, are highly effective having excellent solubility in carbon dioxide.

Examples of surfactants other than fluorine-based surfactants include commonly used hydrocarbon-based surfactants and siloxane-based surfactants. For use in carbon dioxide, siloxane-based surfactants and surfactants containing a polyoxyalkylene group are desirable.

The solvent system of the present invention is a 2-phase system when not containing a surfactant. Due to the addition of a surfactant, it takes the form of micelle (micelle structure), emulsion, dispersion, or the like.

Examples of dehydrating agents are molecular sieves, zeolites, diphosphorus pentoxide, calcium chloride, magnesium sulfate, and the like. A broad range of other dehydrating agents can also be used.

Examples of ingredients other than surfactants are electrolytes (chlorides, bromides, iodides and like halides, nitrates, sulfates, acetates and like organic acid salts, and oxides, hydroxides and the like of alkali metals, alkaline earth metals and transition metals); ceramic particles; metal particles; proteins, lipids and like biogenic substances; etc.

In another preferable embodiment of the present invention, a device for selectively removing a removal target is installed in a circulation line in which circulated is a mixed system containing carbon dioxide, a carbon dioxide-soluble surfactant and the removal target; and by circulating the mixed system, the removal target that has been incorporated into the surfactant is selectively removed.

Surfactants as mentioned above can be advantageously used as the carbon dioxide-soluble surfactant.

Examples of removal targets are water, inorganic salts, resist residues, contaminants, and in particular, contaminants that adhere to clothes and can be removed by cleaning.

Examples of inorganic salts are sulfates, nitrates, phosphates, halides (Cl, Br, F, I), and the like of alkali metals (Na, K, Li, etc.), alkaline earth metals (Ca, Mg, Ba, etc.), transition metals, and like metals.

Resists include a wide variety of resists commonly used in semiconductor and micromachine production. Resist residues include residues resulting from resists and etching agents for dry etching. Such residues can be removed using N-methylpyrrolidinone and like removers.

Examples of contaminants that can be removed in cleaning clothes are organic dyes, fruit juices, oil-based inks, skin oils, beverages, stains from foods and beverages, etc.

The aforementioned dehydrating agents are advantageously usable as removers for selectively removing water.

Examples of removers for selectively removing resist residues are neutral alumina and the like.

Examples of removers for selectively removing inorganic salts are silica gel and the like.

Examples of removers for selectively removing contaminants (in particular, contaminants adhered to clothes for removal by cleaning) are silica gel and the like.

When a nonionic surfactant is used, in order to recover and reuse just a surfactant from water-carbon dioxide micelles formed in carbon dioxide, a column containing a dehydrating agent is connected to a high-pressure system, and a high-pressure fluid is circulated by a circulation pump for dehydration.

Figure 1:
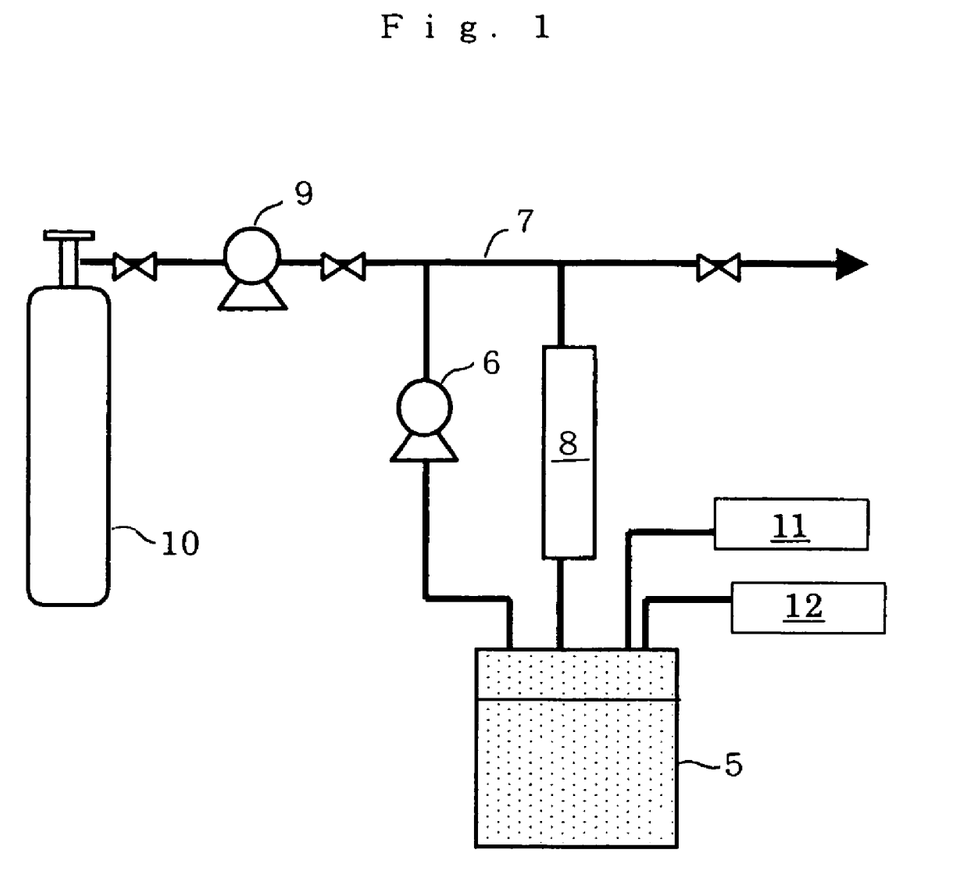
FIG. 1 shows a high-pressure measurement apparatus equipped with a column packed with a dehydrating agent to remove water from the system.

FIG. 1 shows an example of an apparatus that can be used to remove water from a system and recover a surfactant.

The pressure range that can be selected in recovering a surfactant by removing water from carbon dioxide or in removing an inorganic salt, contaminant, etc., and that does not result in pattern collapse and the like is about 50 to about 300 atm, and preferably about 50 to about 150 atm.

When metal ions are present in the system, by using a dehydrating agent in combination with an ion-exchange resin or an ion-exchange membrane, just water and ions can be removed and a surfactant can be recovered and reused. Examples of ion-exchange resins usable herein are, although not limited to, Amberlites IR-120 and 200, XT-1000 and 5000, IRA-400 and 900, and the like. When compounds other than such resins are used, it is possible to recover just a surfactant in carbon dioxide by utilizing the difference in solubility in carbon dioxide and absorptivity to an absorbent.

It is possible to recover just a surfactant in carbon dioxide using a cation-exchange-type ion-exchange resin when an anionic surfactant is used, and an anion-exchange-type ion-exchange resin when a cationic surfactant is used.

Moreover, this method is applicable not only to carbon dioxide but also to the recovery of a surfactant from an emulsion of a reverse micelle-type using a common organic solvent.

Such an emulsion is applicable to chemical processes as presented below, and the present invention greatly contributes to enhancing the efficiency of such chemical processes.

1. Extraction (extraction of natural products, and waste water treatment)
2. Cleaning (especially, cleaning, drying and dehydration of precision machinery components and semiconductor wafers, and cleaning of clothes)
3. Analysis (qualitative and quantitative analyses)
4. Chemical reaction (micromolecule and macromolecule syntheses, and polymer processing)
5. Material production (fine particles and nano-processed materials)
6. Surface treatment (plating)

In another preferable embodiment of the present invention, cleaning and drying of MEMS, micromachines and like precision machinery components, semiconductor wafers, etc., may be carried out as described below using supercritical, subcritical or liquid carbon dioxide.

Figure 2:
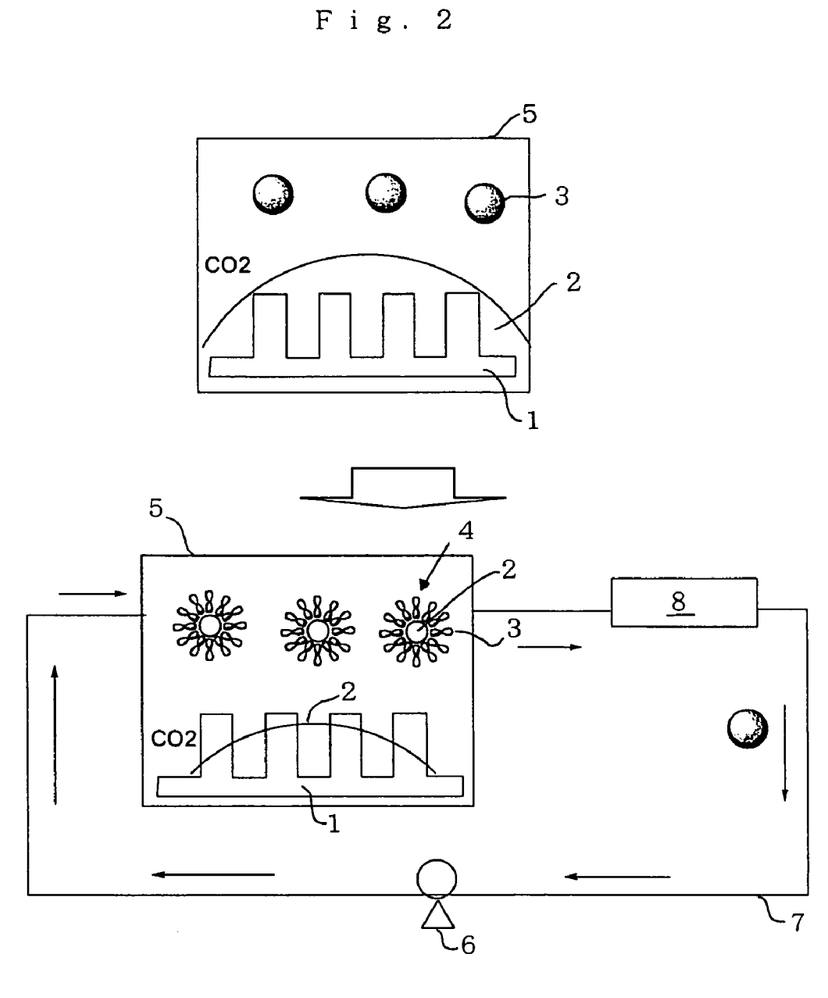
FIG. 2 is a schematic drawing of a resist drying system. A dehydrating agent removes a rinsing fluid, and a surfactant and carbon dioxide return to the device.

As shown in FIG. 2 (resist drying system), micelles are formed in $CO_2$ to disperse a compound (surfactant or cosolvent) that is poorly soluble in $CO_2$ using a compound that has compatibility with both $CO_2$ and the compound that is poorly soluble in $CO_2$ (water, polar compound, polymer, etc., water in particular).

2. A column packed with a substance that adsorbs the compound that is poorly soluble in $CO_2$ is installed in the system.

3. By circulation within the system, the compound that is poorly soluble in $CO_2$ is adsorbed onto the adsorbent and removed.

In this case, the surfactant is circulated while being dissolved in $CO_2$ to utilize its ability to enhance the solubility of polar substances in $CO_2$.

In the system shown in FIG. 2, it is desirable to use a surfactant that dissolves in low-pressure $CO_2$. Although the amount of water (removal target) capable of being dissolved in a surfactant at any one time is small, when a dehydration process (removal of removal target) in which a high-pressure fluid is continuously circulated by a removal device is used in combination, the treatment time can be significantly reduced. Moreover, it can function when the amount of surfactant is reduced.

According to the process described above, a polar substance or the like can be incorporated into $CO_2$ in an amount that cannot be usually dissolved at one time, and can be removed. Advantages of such a technique are, for example:

1. The amount incorporated into $CO_2$ is increased.
2. The amounts of surfactant and cosolvent necessary can be reduced (both impose environmental burdens).
3. The required $CO_2$ temperature and pressure conditions can be relaxed (contributing to reduction in apparatus cost and enhancement of operational safety).
4. It is a great advantage that water can be removed at low pressures because resists are made of polymers that may result in resist deformation due to bubbling when $CO_2$ attains high pressures.

The pressure range usable for a system for washing and drying MEMS, micromachines and like precision machinery components, semiconductor wafers, etc., is from about 50 to about 150 atm (and preferably 100 atm or lower). As there is a pressure range below 70 atm in which gas and liquid coexist, carbon dioxide is usable by connecting the liquid portion to the circulation line. At pressures lower than 50 atm, most of the carbon dioxide is in a gaseous state, and this is not practical. A preferable pressure range is about 50 to about 150 atm, and more preferably about 70 to about 100 atm.

Applications

The present invention is applicable to washing and drying fine resist patterns, and washing and drying of rinsing agents in MEMS (micromachines) production.

It can be assumed that 300 nm of resist thickness will continue to be necessary for etching resistance. It is easily deduced that, in the future when semiconductors have 30 nm patterns, the aspect ratio will be about 10. Based on the data of pattern collapse caused by water rinsing presented in Non-Patent Publication 2, a surface tension for a rinsing agent that does not cause pattern collapse in a pattern having a width of 30 nm and an aspect ratio of 10 was calculated, and surface tensions $\frac{1}{10}^{th}$ or lower of that of water should prevent pattern collapse. According to Non-Patent Publication 3, the interfacial tension between water and $CO_2$ at a surfactant concentration of $10^{-3}$ to $10^{-4}$ mol % is about $\frac{1}{35}^{th}$ to about $\frac{1}{20}^{th}$ of that of water alone (the surface tension of water is 70 nN/m). The concentrations of the surfactants used in the Examples of the present specification is $10^{-3}$ to $10^{-4}$ mol %, and a concentration of $10^{-4}$ mol % is sufficient for drying 30 nm patterns. In addition, it is expected that a concentration of $10^{-3}$ mol % should be applicable to fine resist patterns of about 10 nm. Moreover, use of a surfactant in a concentration of about $10^{-2}$ to about $10^{-3}$ mol % can virtually nullify the interfacial tension. In particular, since fluorine-based surfactants have high solubilities in $CO_2$, most fluorine-based surfactants can be used to avoid pattern collapse that may occur due to the surface tension of water. This theory is applicable to the production of fine metal structures such as MEMS. Fine structures made of materials that are more rigid than resists can be produced with high aspect ratios. Specifically, it is expected that structures having a width of 0.1 μm and an aspect ratio of 100 can be produced without pattern collapse when surfactant is used at a concentration of $10^{-4}$ to $10^{-5}$ mol %.

According to the present invention, a surfactant can be easily recovered for reuse from a solvent system containing water and carbon dioxide. Furthermore, using carbon dioxide as an alternative solvent, precision washing and drying of microstructures can be performed with small amounts of cosolvent and surfactant under low practical pressures.

BEST MODE FOR CARRYING OUT THE INVENTION

Examples are given below to illustrate the invention in more detail; however, the scope of the invention is not limited to these examples.

EXAMPLE 1

A stainless-steel column (6 φ×50 mm) was connected to a window-equipped pressure cell (30 ml) system. The column had been packed with 750 mg of pre-dried molecular sieves 3A.

A fluorine-based surfactant $F-(CF(CF_3)CF_2O)-CF(CF_3)COONH_4$ (440 mg, 1.4 wt. % relative to carbon dioxide) and 260 mg of water were introduced into the device. Carbon dioxide was then introduced into the device to create 100 atm at 50° C. (the amount of water dissolved upon micellee formation under these conditions was 180 mg). The contents of the system was circulated by a circulation pump and observed for 10 hours. Naked-eye observation confirmed that there was no water remaining undissolved in the system (it can be understood that water remaining in the system was removed by the molecular sieves). After the experiment, the molecular sieves 3A in the column were washed with 300 mg of methanol. Spectrometric analyses (NMR and IR) after drying the cleaning fluid proved that the surfactant was barely adsorbed by the molecular sieves.

EXAMPLE 2

Two stainless-steel columns (6 φ×50 mm each) were connected to a window-equipped pressure cell (30 ml) system. Each column had been packed with 500 mg of either pre-converted Amberlite IR-122 or IRA 400. A fluorine-based surfactant $F-(CF(CF_3)CF_2O)-CF(CF_3)COO(CH_2CH_2O)CH_3$ (440 mg, 1.4 wt. % relative to carbon dioxide) and 100 mg of 1% brine were introduced into the device. Carbon dioxide was then introduced into the device to create 150 atm at 50° C. The contents of the system were circulated by a circulation pump for 10 hours. After the experiment, the Amberlite in the columns was washed with 300 mg of methanol. Spectrometric analyses (NMR and IR) after drying the cleaning fluid showed that the surfactant was barely adsorbed by the Amberlite.

The results described above establish that due to the adsorbents the surfactants can be efficiently recovered from the micelles.

EXAMPLE 3

1. Water Removal Test 500 mg of a surfactant $F-(CF(CF_3)CF_2O)_3COO(CH_2CH_2O)_5CH_3$ and 500 mg of water were gently placed in a high-pressure device equipped with a (sapphire) window for visual observation (volume: 38 cc). $CO_2$ was introduced into the high-pressure device at 50° C. until reaching 130 atm. A column packed with 6 g of pre-dried molecular sieves 3A had been installed in the device system. After the contents of the device were circulated for 1 hour by a circulation pump at 6 ml/min while stirring, the contents reached a transparent, homogenous state (showing that water had been uniformly dispersed in $CO_2$ due to the surfactant).

2. Water Removal Test 2

44 mg of $F-(CF(CF_3)CF_2O)_3COO(CH_2CH_2O)_5CH_3$ and 500 mg of water were gently placed in a device as used in "1" above. $CO_2$ was introduced at 30° C. until reaching 88 atm. After the contents were circulated for 2 hours by a circulation pump in the same manner, the contents turned transparent (that is, water not incorporated into the surfactant was entirely removed by the molecular sieves).

3. Water Removal Test 3

85 mg of isopropanol and 500 mg of water were gently placed in a device as used in "1" above. $CO_2$ was introduced at 40° C. until reaching 115 atm. The contents were circulated for 1 hour in the same manner, and the contents became homogenous.

The results of the water removal tests above establish that due to the surfactants the amount of water removable from $CO_2$ can be greatly enhanced, and the temperature and pressure conditions necessary for removal of water can be greatly relaxed.

4. Drying of Resist Pattern

Figure 3:
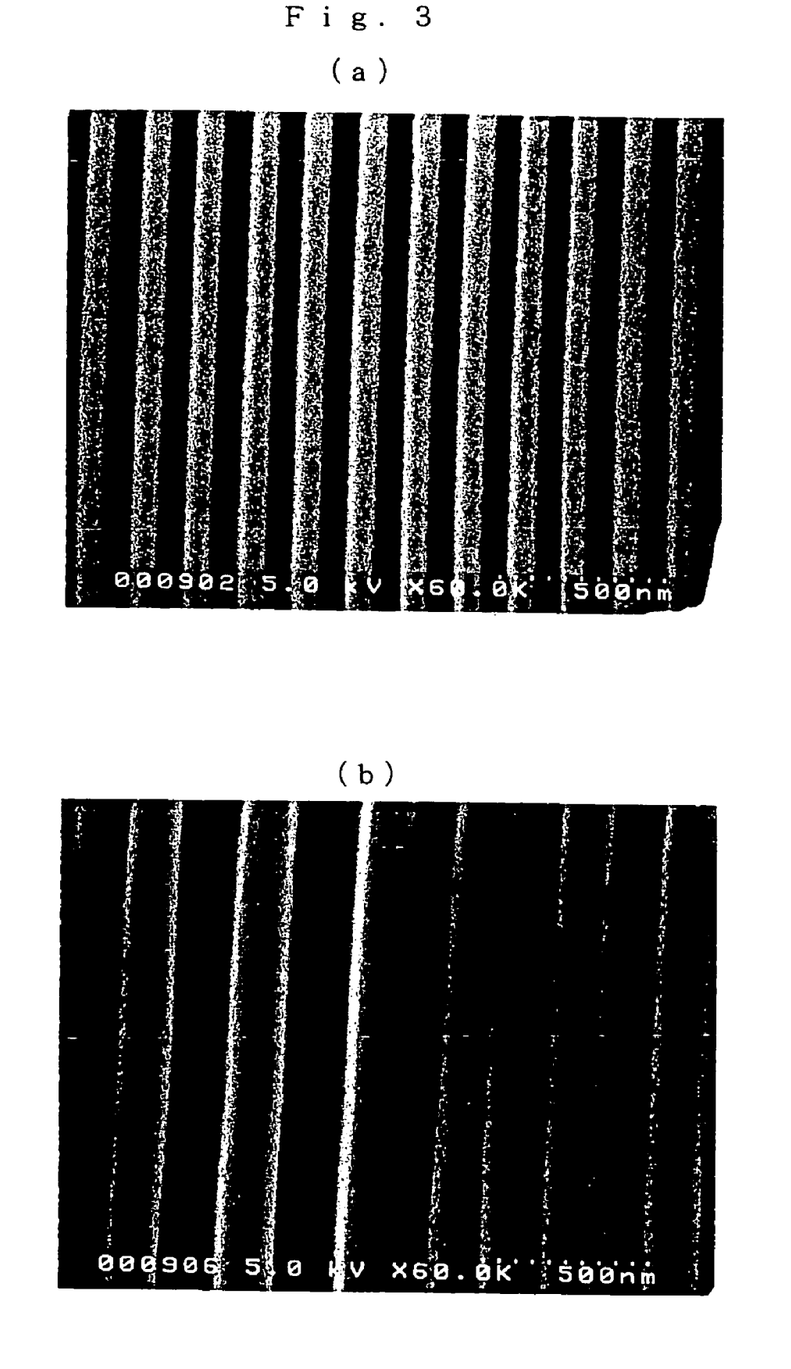
FIG. 3 presents the results of SEM observation.

A wafer (1 cm per side) having a 70 nm pattern formed on a resist ZEP520 (thickness: 350 nm) of Nippon Zeon Co., Ltd., according to an EB method was wetted with an aqueous ammonium perfluorooctanoate solution and then rinsed 5 times with water. Space between the resist patterns was thereby filled with water. The sample was gently placed in a device as used in the Examples, and 50 mg of $F-(CF(CF_3)CF_2O)_3COO(CH_2CH_2O)_5CH_3$ was added thereto. $CO_2$ was introduced at 30° C. until reaching 88 atm. The contents were circulated for 1 hour under these conditions (and it was confirmed that the contents had turned transparent). The surfactant was removed by extraction over 10 minutes by circulating $CO_2$ at a rate of 5 ml/min under the same conditions throughout the system equipped with a dehydration column packed with silica gel as shown in FIG. 2. SEM observation confirmed that pattern collapse did not occur on the wafer sample and the patterns had been dried. The results of SEM observation are presented in FIG. 3(*a*).

Comparative Example 1

In a system lacking a device with an installed column packed with molecular sieves 3A, the amount of water dissolved in $CO_2$ at 130 atm at 50° C. in this vessel was 160 mg when 500 mg of $F-(CF(CF_3)CF_2O)_3COO(CH_2CH_2O)_5CH_3$ was used. It took about 12 hours to mix this amount of water with the $CO_2$.

Comparative Example 2

In a system lacking a device with an installed column packed with molecular sieves 3A, the amount of water dissolved in $CO_2$ at 130 atm at 50° C. without circulation was no more than 40 mg when 44 mg of a surfactant $F—(CF(CF_3)CF_2O)_3COO(CH_2CH_2O)_5CH_3$ was used.

Comparative Example 3

In a system lacking a device with an installed column packed with molecular sieves 3A, when 44 mg of a surfactant $F—(CF(CF_3)CF_2O)_3COO(CH_2CH_2O)_5CH_3$ was used, water was nearly insoluble in $CO_2$ at 88 atm at 30° C. over 24 hours.

Comparative Example 4

In a system lacking a device with an installed column packed with molecular sieves 3A, when 85 mg of isopropanol was used, the amount of water dissolved in $CO_2$ was no more than 50 mg.

Comparative Example 5

In a device as used in Example 3–1, just water (500 mg) was gently placed with neither surfactant nor water-soluble organic solvent. $CO_2$ was introduced thereto until reaching 130 atm at 50° C. Although the contents were circulated for 12 hours within a column packed with molecular sieves 3A while stirring, the water remained undissolved.

The results presented above establish that a dehydrating agent-packed column as well as a surfactant or cosolvent are necessary to carry out the present invention efficiently.

Comparative Example 6

Water remaining on a wafer sample that had been treated under the same conditions as in Example 3–4 (liquid $CO_2$ at 30° C. at 88 atm for about 1 hour) was dried under reduced pressure. SEM observation showed that most of the patterns had collapsed. The results of the SEM observation are presented in FIG. 3(b).

In consideration of the experiments above, the present invention is effective in drying fine semiconductor resist wafers that may easily suffer pattern collapse.

Hereinbelow, the ability to remove compounds, other than water, that are barely soluble in $CO_2$ was investigated.

EXAMPLE 4

Inorganic Salt (KBr) Removal By Dissolving 30 mg of KBr, 100 mg of water, and 100 mg of a surfactant $F—(CF(CF_3)CF_2O)_3COO(CH_2CH_2O)_7CH_3$ were gently placed in a device as used in Example 1 that had been equipped with a column packed with 5 g of silica gel. $CO_2$ was introduced at 50° C. until reaching 150 atm. After circulation for 1 hour while stirring, the contents turned transparent. The amount of KBr dissolved due solely to $CO_2$ and the surfactant that were present in the system under these conditions was about 3 mg.

Resist Removal

A column packed with 5 g of neutral alumina was installed in an experimental device. A PHS-based resist (thickness: 400 nm) that had been lithographed with a 130 nm pattern and dry-etched was used as a sample. A wafer sample cut into 1 cm×1 cm pieces was gently placed in a high-pressure device (volume: 38 cc). 50 mg of N-methylpyrrolidinone and 20 mg of perfluorooctylacrylate were added thereto, and $CO_2$ was then introduced at 70° C. until reaching 150 atm. After the contents were circulated for 10 minutes by a circulation pump at 5 ml/min while stirring, residues such as the surfactant were removed by extraction at 150 atm at 5 ml/min over 10 minutes. A similar operation was performed without using a circulation pump. After the respective experiments, the wafer samples were subjected to SEM observation. The extent of resist removal was compared in terms of the number of patterns on which resist residues had been removed out of 100 patterns. When the circulation system was used, the extent of removal was about 60%, and when the circulation system was not used, the extent of removal was about 20%.

Example of Washing Contaminants Adhered to Fibers

A column packed with 5 g of silica gel was installed in the line of an experimental system. A cotton fabric that had been stained with a red wine over a radius of 3 cm was used as a sample and gently placed in a high-pressure vessel. Further, 30 mg of $F—(CF(CF_3)CF_2O)_3COO(CH_2CH_2O)_7CH_3$ was introduced into the vessel. $CO_2$ was introduced until reaching 100 atm. The contents of the vessel were circulated at 40° C. for 10 minutes, and then removed by extraction at 100 atm at a rate of 5 ml/min for 10 minutes. After removing the sample, the size of the stain was measured. The stain had shrunk to a radius of about 2 cm, and the color thereof had become substantially pale. A similar operation was performed without circulation. The size of the stain was about 2.5 cm. The color thereof was paler than it was before $CO_2$ treatment, but significantly darker than in the previous experiment.

Removal of Etching Residue

A silicon wafer sample (1 cm×1 cm pieces) that had been resist-pattern-developed and dry-etched was gently placed in a high-pressure device (volume: 38 cc). Further, 30 mg of a surfactant $F—(CF(CF_3)CF_2O)_3COO(CH_2CH_2O)_7CH_3$ was introduced. $CO_2$ was introduced until reaching 150 atm. The contents of the vessel were circulated at 40° C. for 30 minutes while stirring (a column packed with 10 g of silica gel was installed in the line to remove inorganic residues and organic polymeric residues). While incorporating the surfactant remaining on the wafer into the $CO_2$ pressurized to 150 atm, extractive removal was performed at 5 ml/min for 20 minutes. A comparative experiment was performed under the same conditions without circulation. After purging $CO_2$, the wafer samples were subjected to SEM observation, and removal of etching residues was confirmed. The extent of residue removal was determined according to SEM observation based on the number of particles present over an area of 100 nm×100 nm before and after the test. The extent of removal using a circulation pump was about 90% but only 40% without a circulation pump.

The invention claimed is:

1. A method for recovering a surfactant from a water-carbon dioxide system comprising at least one type of surfactant, water and carbon dioxide,
   the method comprising the step of bringing the water-carbon dioxide system into contact with a dehydrating agent to remove water.

2. The method according to claim 1, wherein the water-carbon dioxide system is a micelle, emulsion or homogenous dispersion system prepared by adding at least one type of surfactant to a two-phase system of water and carbon dioxide.

3. The method according to claim 1, wherein the water-carbon dioxide system comprises a non-surfactant component which is removed by adsorption together with or separately from water.

4. The method according to claim 1, wherein the surfactant is a fluorine-based surfactant.

5. The method according to claim 1, wherein a fluorine-based surfactant and a non-fluorine-based surfactant are used as surfactants, and a mixture of these surfactants is recovered.

6. The method according to claim 1, wherein a cosolvent (entrainer) is used.

7. The method according to claim 1, wherein the carbon dioxide is either liquid, subcritical or supercritical.

8. A method for recovering and reusing a surfactant,
the method comprising the steps of, in an aqueous solution system of liquid, subcritical or supercritical carbon dioxide and an electrolyte, carrying out in the presence of at least one type of surfactant an electrochemical reaction, dehydrating the solution after the reaction, and recovering and reusing surfactant-containing carbon dioxide.

9. The method according to claim 8, wherein the electrochemical reaction is plating.

10. A method for recovering a surfactant,
the method comprising the steps of washing, drying, or dehydrating a precision machinery component or a semiconductor wafer using a water-carbon dioxide system comprising at least one type of surfactant, water, and liquid, subcritical or supercritical carbon dioxide, and bringing the water-carbon dioxide system into contact with a dehydrating agent.

11. A method comprising the steps of installing a device for selectively removing a removal target in a circulation line in which circulated is a mixed system comprising carbon dioxide, a carbon dioxide-compatible surfactant and/or a cosolvent, and a removal target; circulating the mixed system; and selectively removing the removal target that has been incorporated into the surfactant and/or cosolvent.

12. The method according to claim 11, wherein the removal target is water, an inorganic salt, a resist residue or a contaminant.

13. The method according to claim 11, wherein the carbon dioxide is either supercritical, subcritical or liquid.

14. The method according to claim 11, wherein the removal target is water and the removal device is filled with a dehydrating agent.

15. An apparatus for removing a removal target from a high-pressure fluid comprising carbon dioxide and a surfactant,
the apparatus being equipped with a high-pressure device into which carbon dioxide, a surfactant, and a removal target or an item comprising the removal target are introduced; a circulating pump for circulating in a circulation line a high-pressure fluid comprising carbon dioxide, a surfactant and the removal target; and a removal device in the high-pressure line for removing the removal target,
the apparatus being designed to selectively remove at the removal device a carbon dioxide-insoluble removal target incorporated into the high-pressure fluid in the form of a micelle, emulsion or homogenous dispersion system by means of the surfactant.

* * * * *